United States Patent
Bilas (10) Patent No.: US 6,552,524 B1
(45) Date of Patent: Apr. 22, 2003

(54) HIGH SPEED POWER SYSTEM HIGH VOLTAGE TRANSIENT DAMAGE ASSESSMENT

(75) Inventor: Ronald J. Bilas, Murfreesboro, TN (US)

(73) Assignee: Square D Company, Palatine, IL (US)

(*) Notice: Subject to any disclaimer, the term of this patent is extended or adjusted under 35 U.S.C. 154(b) by 0 days.

(21) Appl. No.: 09/957,150

(22) Filed: Sep. 20, 2001

(51) Int. Cl.[7] .......................... G01R 19/00; G01R 13/14
(52) U.S. Cl. ................................ 324/76.11; 324/76.15
(58) Field of Search ........................... 324/76.11, 76.15, 324/76.82, 76.83, 76.16, 76.38; 702/57–66

(56) References Cited

U.S. PATENT DOCUMENTS

| | | | |
|---|---|---|---|
| 5,890,097 A | * 3/1999 | Cox | 702/67 |
| 6,198,403 B1 | * 3/2001 | Dorrough et al. | 340/635 |
| 6,429,785 B1 | * 8/2002 | Griffin et al. | 340/870.02 |
| 6,459,997 B1 | * 10/2002 | Andersen | 702/57 |

OTHER PUBLICATIONS

"Powerlogic® Advanced Power Reliability Solutions," Square D Schneider Electric, brochure, 2000, 3 pages doublesided.
"Powerlogic® Circuit Monitor—Series 2000," Class 3020, Square D Schneider Electric, brochure, 3 pages doublesided, 1998.
"Powerlogic® Power Meter," Class 3020, Square D Schneider Electric, brochure, 1998, 2 pages doublesided.
"Powerlogic® Metering & Monitoring Devices," Square D Schneider Electric, brochure, 2000, 2 pages doublesided.
"Powserlogic® Power Monitoring and Control System," Square D Schneider Electric, brochure, 1998, 4 pages doublesided.
"Powerlogic® Series 4000 Circuit Monitor," Square D Schneider Electric, brochure, 2000, 3 pages doublesided.

* cited by examiner

*Primary Examiner*—N. Le
*Assistant Examiner*—John Teresinski
(74) *Attorney, Agent, or Firm*—Larry I. Golden; Michael J. Femal (57) ABSTRACT

A method for detecting, in real time, high energy transients in an electrical power system, the method including obtaining real time data defining a power waveform, converting the data to digital data, calculating from the digital data a plurality of test point values, calculating incremental area values corresponding to differences between each adjacent pair of the plurality of test point values, an incremental time interval between adjacent the test point values being defined as a unit width of the area, such that the cumulative area under the waveform at a given testpoint is equal to the sum of the area calculated at that test point and the area, calculated at the previous test point, calculating the area of the waveform between adjacent pairs of test points by substracting the cumulative area at the later in time of the test points from the cumulative area at the earlier in time of the test points, and comparing each the area calculated under the waveform with an area at corresponding points in time on an ITI curve.

36 Claims, 3 Drawing Sheets

HIGH SPEED POWER SYSTEM HIGH VOLTAGE TRANSIENT DAMAGE ASSESSMENT

FIELD OF THE INVENTION

This invention is directed generally to electrical power monitoring and more particularly to a system and method for detecting high energy (e.g. voltage) transients in a power system.

BACKGROUND OF THE INVENTION

High voltage transients can cause damage to power systems. The amount of damage depends on the amplitude and duration of the transient. This invention uses the Information Technologies Industries curve (ITIC) to analyze power system data in real time. Current products do this analysis off line because of the computationally intensive nature of the calculation. This invention runs in real time.

The calculation runs in real time and continuously compares incoming waveforms to all points on the ITI curve. Harmful transients are identified and differentiated from harmless transients.

The invention provides continuous, automatic monitoring of power systems for the purpose of detecting transients that may cause harm to equipment connected to the power system.

SUMMARY OF THE INVENTION

Briefly, in accordance with the foregoing, a method for detecting, in real time, high energy transients in an electrical power system, comprises obtaining real time data defining a power waveform, converting the data to digital data, calculating from the digital data a plurality of test point values, calculating incremental area values corresponding to differences between each adjacent pair of the plurality of test point values, an incremental time interval between adjacent the test point values being defined as a unit width of the area, such that the cumulative area under the waveform at a given testpoint is equal to the sum of the area calculated at that test point and the area, calculated at the previous test point, calculating the area of the waveform between adjacent pairs of test points by substracting the cumulative area at the later in time of the test points from the cumulative area at the earlier in time of the test points, and comparing each the area calculated under the waveform with an area at corresponding points in time on an ITI curve.

In accordance with another aspect of the invention, a method for detecting, in real time, high energy transients in an electrical power system, comprises obtaining real time data defining a power waveform, converting the real time data to digital form, converting the digital data to a unipolar absolute value, calculating a test point, determining a time intersect of the test point and an ITI curve, calculating an area corresponding to the test point and replacing the calculated area with the sum of the absolute value and an area at a prior test point, calculating an area of the waveform between a zero time intersect and an ITI curve time intersect with the test point, determining whether the waveform area is greater than or equal to a rectangular area under the ITI curve at the time intersect, if not, advancing to the next test point, if so, determining whether the data point at the time intersect is greater than or equal than the value of the ITI curve at the time intersect, and if not, advancing to the next data point, and if so, producing a trigger command.

In accordance with another aspect of the invention, a system for detecting, in real time, high energy transients in an electrical power system comprises means for obtaining real time data defining a power waveform, means for converting the data to digital data, means for calculating from the digital data a plurality of test point values, means for calculating incremental area values corresponding to differences between each adjacent pair of the plurality of test point values, the incremental time between adjacent the test point values being defined as a unit with of the area, such that the cumulative area under the waveform at a given test point is equal to the sum of the area calculated at that test point and the area, means for calculated at the previous test point, means for calculating the area of the waveform between adjacent pairs of test points by substracting the cumulative area at the later in time of the test points from the cumulative area at the earlier in time of the test points, and means for comparing each the area calculated under the waveform with an area at corresponding points in time on an ITI curve.

In accordance with another aspect of the invention, A system for detecting, in real time, high energy transients in an electrical power system comprises means for obtaining real time data defining a power wave form, means for converting the real time data to digital form, means for converting the digital data to a unipolar absolute value, means for calculating a test point, means for determining a time intersect of the test point and an ITI curve, means for calculating an area corresponding to the test point and replacing the calculated area with the sum of the absolute value and an area at a prior test point, means for calculating an area of the waveform between a zero time intersect and an ITI curve time intersect with the test point, means for determining whether the waveform area is greater than or equal to a rectangular area under the ITI curve at the time intersect, if not, advancing to the next test point, if so, determining whether the data point at the time intersect is greater than or equal than the value of the ITI curve at the time intersect, if not, advancing to the next data point, and if so, producing a trigger command.

DETAILED DESCRIPTION OF THE ILLUSTRATED EMBODIMENT

Processing the ITIC is computationally intensive. Current techniques do it off line for this reason. This invention reduces the calculation to a series of simple additions and subtractions that can be run either on custom hardware or an inexpensive Digital Signal Processor (DSP). The invention measures destructive energy input into a power system by comparing the amplitude and duration of an input waveform with the ITI defined decaying logarithmic curve. The ITI curve disproportionately weighs transients according to their amplitude, i.e., high voltage transients do more damage to a power system at a constant duration than low voltage transients, so the curve is not linear.

The invention does a continuous volt-second calculation (through integration) of all sampled voltage points and constantly compares it to the volt-second information inherent in the ITIC. The waveform can be thought of as moving through a constant length window and superimposing it on the ITIC within the window. Any point outside the limits of the ITIC causes a "trigger" that signifies a damaging transient has occurred in the system.

Trigger points are determined by comparing the area of the waveform from the current time=0 axis to the point where a previous point on the waveform crosses the TIC. If the area of the waveform between the current time=0 axis and the time point, TC, where the waveform crosses the ITIC is greater than the area of the rectangle formed by the time=0 axis and tc, then the ITIC threshold is exceeded and a harmful transient is assumed.

Only additions and subtractions are used in the calculation so there is no need for multipliers or other expensive hardware. Extensive use is made of precalculated lookup tables so that the actual real-time calculation runs very fast.

This approach is an improvement over the one technique presently in use (e.g. in the Square D Co. CVT (power monitor) which in effect can only compare transients at a single point on the ITIC. The approach described above is not limited to a single point because, in essence, it compares every input voltage data point with every point on the ITIC simultaneously and therefore finds all "trigger points" no matter where they are on the curve.

The following paragraphs describe a computationally intense method of calculating trigger points on an ITI (formerly CBEMA) curve to determine stress on power systems. This method cannot presently be run in a real time system.

Start the process by finding the equation of the ITI curve from the graph at the web site. The following section finds a mathematical representation of the curve on the ITI web site. Mathcad™ was used to do the calculations.

$$t := \frac{.00005}{60}, \frac{.0001}{60} \cdots \frac{6}{60}$$

Find equation from ITI curve, use: y=m·log(x)+k find m and k

First part of curve, solve for m, k:

$$Va := \begin{pmatrix} 500 \\ 200 \end{pmatrix}$$

$$MTX2a := \begin{pmatrix} \log\left(.01 \cdot \frac{1}{60}\right) & 1 \\ \log\left(.1 \cdot \frac{1}{60}\right) & 1 \end{pmatrix}$$

sol2 a:=lsolve (MTX 2a, Va)

$$sol2a = \begin{pmatrix} -300 \\ -633.445 \end{pmatrix}$$

m2a:=sol2a$_{0,0}$
k2a:=sol2a$_{1,0}$
g(t):=m2a·log(t)+k2a

Second part of curve, solve for m, k:

$$Vb := \begin{pmatrix} 200 \\ 140 \end{pmatrix}$$

$$MTX2b := \begin{pmatrix} \log\left(.1 \cdot \frac{1}{60}\right) & 1 \\ \log\left(.2 \cdot \frac{1}{60}\right) & 1 \end{pmatrix}$$

sol2b:=lsolve(MTX2b, Vb)

$$sol2b = \begin{pmatrix} -199.316 \\ -353.729 \end{pmatrix}$$

m2b:=sol2b$_{0,0}$
k2b:=sol2b$_{1,0}$
g2(t):=m2b·log(t)+k2b $$g12(t) := \text{if}\left[t \le \frac{.1}{60}, g(t), \left(\text{if}\left(t \le \frac{.2}{60}, g2(t), \text{if}\left(t \le \frac{50}{60}, 120, 110\right)\right)\right)\right] \quad (1)$$

Figure 1:
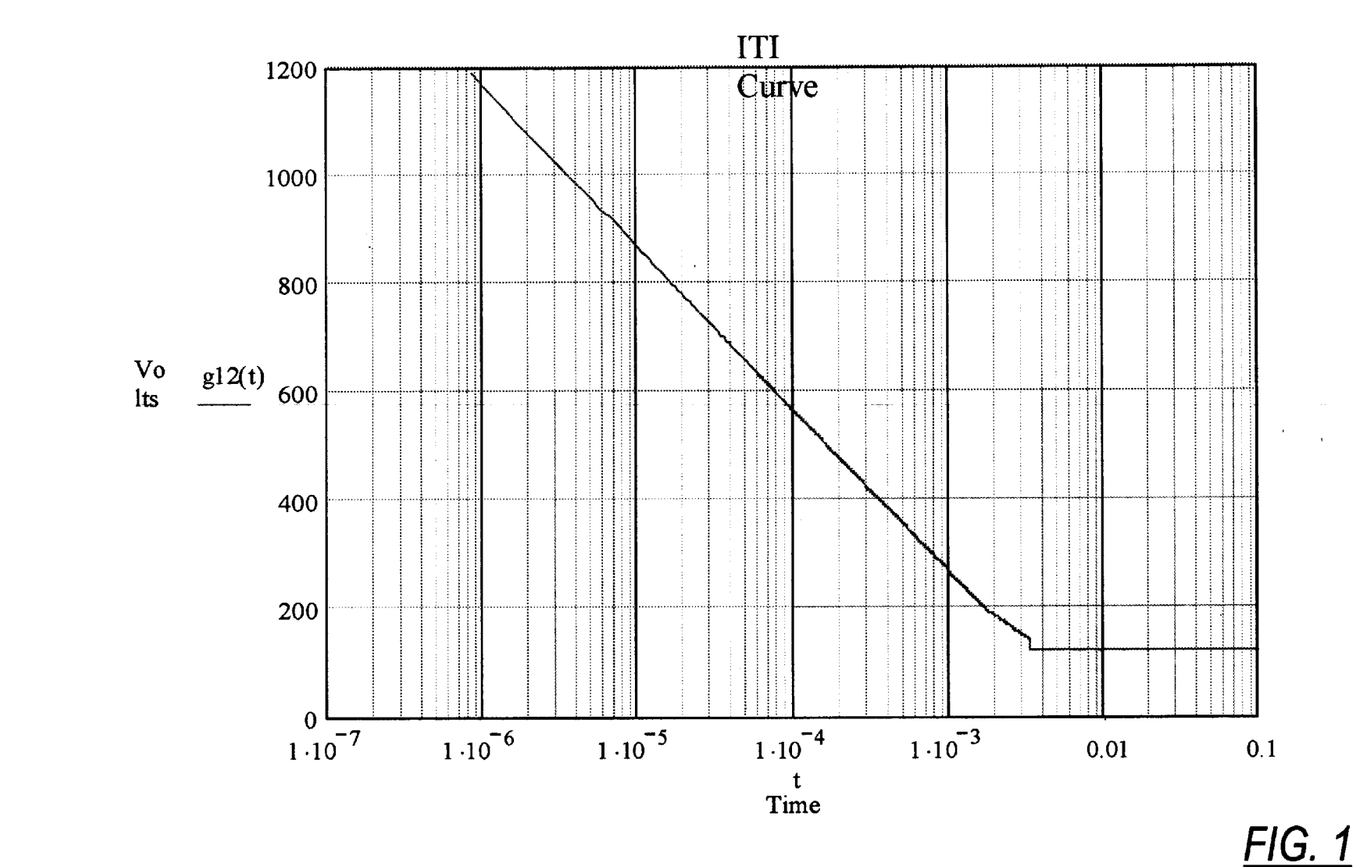
FIG. 1 is a graphical representation of an ITIC curve.

The curve of FIG. 1 is the graphical representation of derived equation (1). The slopes of the curve change at the following voltage levels: 200, 140, and 120. It steps down again to 110 volts at 833 msec (50 cycles). The above curve spans the range of about 500 ns through 0.1 sec (about 6 cycles).

The ITI curve permits a measurement of stress on a power system by measuring the time a power waveform spends outside of the curve. When an input waveform's amplitude and duration place it outside of the curve, this is called a trigger point. The purpose of the algorithm described herein is to calculate the trigger point for any input waveform.

Figure 2:
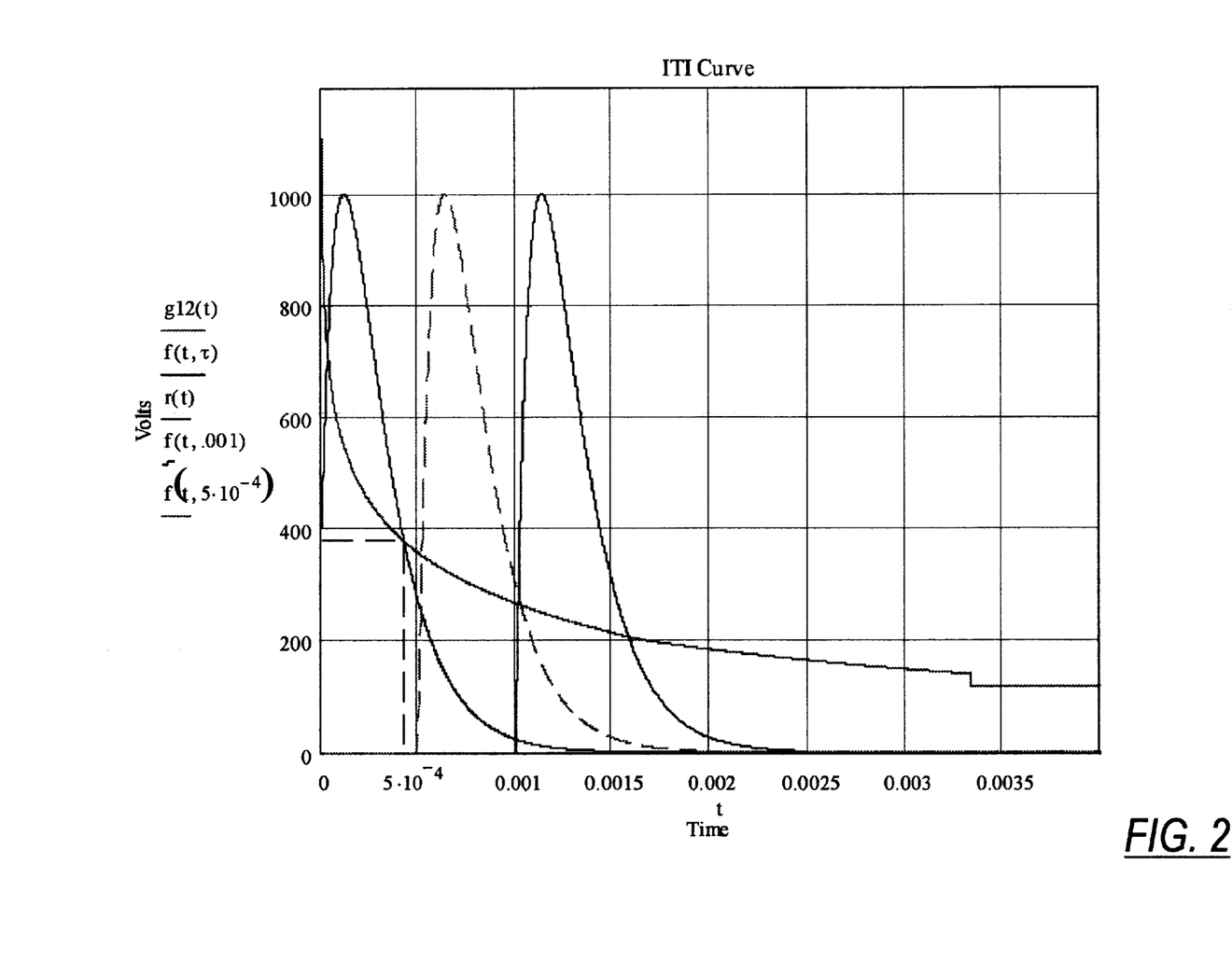
FIG. 2 is a graphical comparison of a sample waveform with an ITI curve.

The next section will derive a graphical view of the problem using a specific generated waveform and comparing it with the ITI curve (see FIG. 2).

First generate a specific curve to compare against the ITI curve:

$$\tau := -2.23 \times 10^{-5}$$

$$t := \frac{.0001}{60}, \frac{.0002}{60} \cdots \frac{1}{60}$$

$$a(t,\tau) := \text{if}[t-\tau<0, 0, 4000[e^{-5000(t-\tau)} - e^{-10000(t-\tau)}]] \quad (2)$$

y:=a(0,τ)
The next equation finds the x intersect point for a given y value.

$$\text{time} := \text{if}\left(y \ge 200, 10^{\frac{y-k2a}{m2a}}, \text{if}\left(y \ge 140, 10^{\frac{y-k2b}{m2b}}, 10^{\frac{141-k2b}{m2b}}\right)\right) \quad (3)$$

b(t):=1
f(t,τ):=|a(t,τ)·b(t)|
The next equation generates a rectangle for a point where the input waveform a(t,τ) crosses the x=0 point and also intersects the ITI curve. This generates a rectangle that will be used in the calculation.
r(t):=if(t<time,g12(time),0)
FIG. 2 shows the ITI curve g12(t), the rectangle r(t) at the t=0 test point, and three "snapshots" of the input waveform a(t,τ) at various values of τ. A classical method of solving the problem would proceed as follows:
First note that the actual ITI curve is much compressed to the left when plotted on a linear scale. Using the generated equations, the ITI curve is only 200 ns wide (the sample rate) at less than 1400 volts. This is a relatively low voltage phenomena compared to the 6000 volt transient range of the Square D CVT power monitor module.

The first thing to recognize is that the input waveform and the ITI curve can be superimposed and displayed together on the same graph as shown in FIG. 2. Start by defining a solution window that has the ITI curve drawn. The curve (FIG. 2) shows what the window would look like if it was ¼ cycle in width. Incoming waveforms enter from the right and move left. FIG. 2 shows the same input waveform at three different times. Classically, the wave can be moved by adjusting $\tau$.

As the waveform moves through the window, integration is performed on it over the entire window for each value of $\tau$. For the waveform given above, a narrower window could be used to get accurate results but the window must be wide enough to accommodate any waveform that could cause a trigger (a wide, low amplitude pulse, for example). The following equation would result, $$Area = \int_0^{WindowWidth} 4000 e^{-5000(t-\tau)} - e^{-10000\tau} \, dt$$

As the waveform moves through the window, the solution algorithm does nothing until the leading edge of the waveform reaches the left axis. For each value of X a value of y (volts) can then be calculated at t=0 using equation (2), y=a(0, $\tau$). Knowing this value of y intersect, the t intersect on the ITI curve can be found using equation (3). Once t intersect and y intersect are known, the area of the rectangle under the intersection point is simply t*y. The area of the input waveform has to be compared with this input rectangle to determine if a trigger has occurred, i.e., $$Area = \int_0^{t_{intersect}} 4000 e^{-5000(t-\tau)} - e^{-10000\tau} \, dt$$

must be greater than or equal to y intersect*t intersect for there to be a possible trigger.

The area of the input waveform exceeding the area of the rectangle is a necessary condition for a trigger point but it is not sufficient. It's possible that the input waveform can have an area greater than the area of the rectangle but a trigger point still not occur. The remaining condition is that the value of the waveform y waveform, must be greater than or equal to y intersect at the ITI curve intersect t intersect. If these two conditions are met a trigger point has been reached.

In summary, the two conditions necessary to cause an ITI trigger to occur are:

$$\int_0^{t_{intersect}} waveform(t - \tau) \, dt >= y_{intersect} * t_{intersect} \text{ and,} \quad 1)$$

$$y_{waveform} >= y_{intersect @ t_{intersect}} \quad 2)$$

FIG. 2 shows the solution graphically. For the two time periods where the wave fronts have not yet reached the left axis of the window, there can be no trigger point since the leading edge of the waveform has not yet reached the left axis.

At some value of $\tau$, the wave front will reach the left axis and intersect points will begin to be calculated (they'll be zero at all other values of $\tau$ before this point). Shortly after the wave front first reaches the axis, $\tau$ will reach a value where the wave front will just barely reach a trigger point. This point is shown in the diagram by the waveform on the far left of the graph.

The rectangle is shown below the waveform at the trigger point. If the waveform is moved slightly to the right, there won't be a trigger because condition 2) will not be met even though condition 1) is met. At the point shown in the graph, both conditions are met and a trigger will occur.

There is a time delay from the time the input waveform enters the window and the time that a trigger occurs. This delay is precisely equal to the width of the window. If the window is ¼ cycle wide, there can be no trigger for ¼ cycle from the time the trigger point enters the window until the trigger is detected by the algorithm.

An equation of the incoming waveform is required to compute the integral. A real world waveform is likely to be very complex and not reducible to a simple equation.

This method is very computationally intensive and has no hope of working in real time.

Real Time ITI Trigger Algorithm

Another method was found to make the ITI usable in a real time system. The method of the invention, described below, reduces to a relatively simple and fast algorithm. It uses only additions and subtractions and no multiplications.

These facts allow it to be implemented in a moderate field programmable gate array (FPGA) or maybe even a programmable logic device (PLD). External memory would also be required if the algorithm is implemented in an FPGA. With such an implementation, a real time sampling rate of at least 1 Mhz per channel could probably be achieved.

A much simpler and more cost effective implementation would use a high speed, inexpensive digital signal processor (DSP) with enough on board memory to allow a single chip solution. The maximum sample rate depends on the speed of the processor.

The basis of the algorithm is the same as the "classical" solution described above. An incoming waveform is integrated through a window and compared with a fixed ITI curve. But instead of using analog techniques, digital sampling is used. The use of numerical integration using sums of rectangles eliminates the need to generate an equation of the incoming waveform. It also uses pre-calculated lookup tables so that no complex, time-consuming calculations need to be done.

This description describes how the algorithm processes a single channel, i.e., it has to be run three times to process all three channels. Several arrays are used to compute the trigger points. The first is a 32 bit wide array that stores the continuous integration of the incoming waveform. Call this array Area[ ]. The second is 16 bits wide and stores the ITI curve. Call this array ITI[ ]. The third array is 32 bits wide and stores the area of the rectangles under the intersect points of the curve. Call this array Rectangle[ ]. This array may not be necessary if a high speed DSP multiplier is available. Since the CVT uses 12 bit A/D converters and absolute values are used in the trigger calculation, there are 2048 possible input voltages. At initialization the arrays are filled as follows:

1) Area[ ] is cleared,
2) The ITI curve is calculated at 2048 points and stored in ITI[ ]. Each of the 2048 input values indexes into this array. The value stored at each address represents the t intersect point on the ITI curve for each of the 2048 possible input voltages.

3) The rectangular area under each of the possible 2048 intersect points is calculated and stored. Each of the 2048 possible input voltages has an associated intersect rectangular area stored in this array.

Area[ ] is a circular buffer whose length is equal to the number of sample points in the window. There are several important features of the buffer that should be noted. First, it should be set to a length that is a power of 2. Although the algorithm will run with a circular buffer length that is not a power of 2, it will run faster if the length is a power of 2.

Second, each element in the Area[ ]array represents the sum of the areas of all preceding elements, whether they are in the window or have been overwritten. Also, the width of each element is set equal to '1' unit width. These points facilitate the operation and speed of the algorithm. Making the width (time) of each element equal to '1' unit means that a multiplication is not necessary when computing the area under each incoming data point. Using these rules, each new element is simply the sum of the last element and the new data from the A/D converter.

Since the array is circular, all address calculations must be performed using circular arithmetic. It's important to remember that each element represents the sum of all elements that preceed it.

If Vabs is the value of the current input data word after it's converted to bipolar and its absolute value is taken, then the value of each new element in the Area[ ] array can be calculated:

$$Area_i = Vabs_i + Area_{i-1} \quad (4)$$

(use circular arithmetic to calculate i)
where $$Area_{i-1} = Vabs_{i-1} + \sum_{k=0}^{i-2} Vabs_k$$

The area calculations in the algorithm use differences. The area between any two time points of a waveform can be calculated with a single subtraction. Equation (4) can be used to find the area between t1 and t2. Another useful feature of equation (4) becomes apparent if it's rearranged as:

$$Vabs_i = Area_i - Area_{i-1} \quad (5)$$

The algorithm uses this fact to save memory. As long as the width of each element is '1', the value of Vabs at any point in the window can be determined with a single subtraction. So a separate array of input values does not need to be maintained. The algorithm uses this observation to see if a test point satisfies the second trigger condition.

The difference between any two entries in the Area[ ] array will yield the area under the waveform that generated the array between the two points. The entries in Area[ ] represent the total area of the incoming waveform since the algorithm started running. It's not just the area of the current window. However, the algorithm can only compute the area in the current window since all previous information about individual elements will be lost because they have been overwritten. The window can be thought of as just the last few elements of a calculation that has been proceeding for some time.

For the purposes of the ITI trigger calculation, the window will be several thousand entries long. Each entry in the Area[ ] array is a 32 bit unsigned value. Since the entries in the array are constantly getting larger, they will eventually overflow. However, if unsigned subtractions are used in the difference calculation, the result will be correct even when the 32 bit result overflows. The only requirement is that the total area under any waveform that is currently in the window must fit in the variable used to store the result. This will insure that the circular subtraction will not create aliases and incorrect results.

For example, the maximum absolute value of any input from the 12 bit CVT AID converters is 11 bits or 2047. The maximum possible area is 8196*2047=16.8 million if the array size is 8196. This is well within the range of the 32 bit numbers used in Area[ ].

The area under any waveform segment between any two points t1 and t2 is:

$$SegmentArea = Area_{t1} - Area_{t2}$$

This single subtraction is all that's needed to get the area under any part of a waveform in the window.

The ITI Trigger Algorithm

Figure 3:
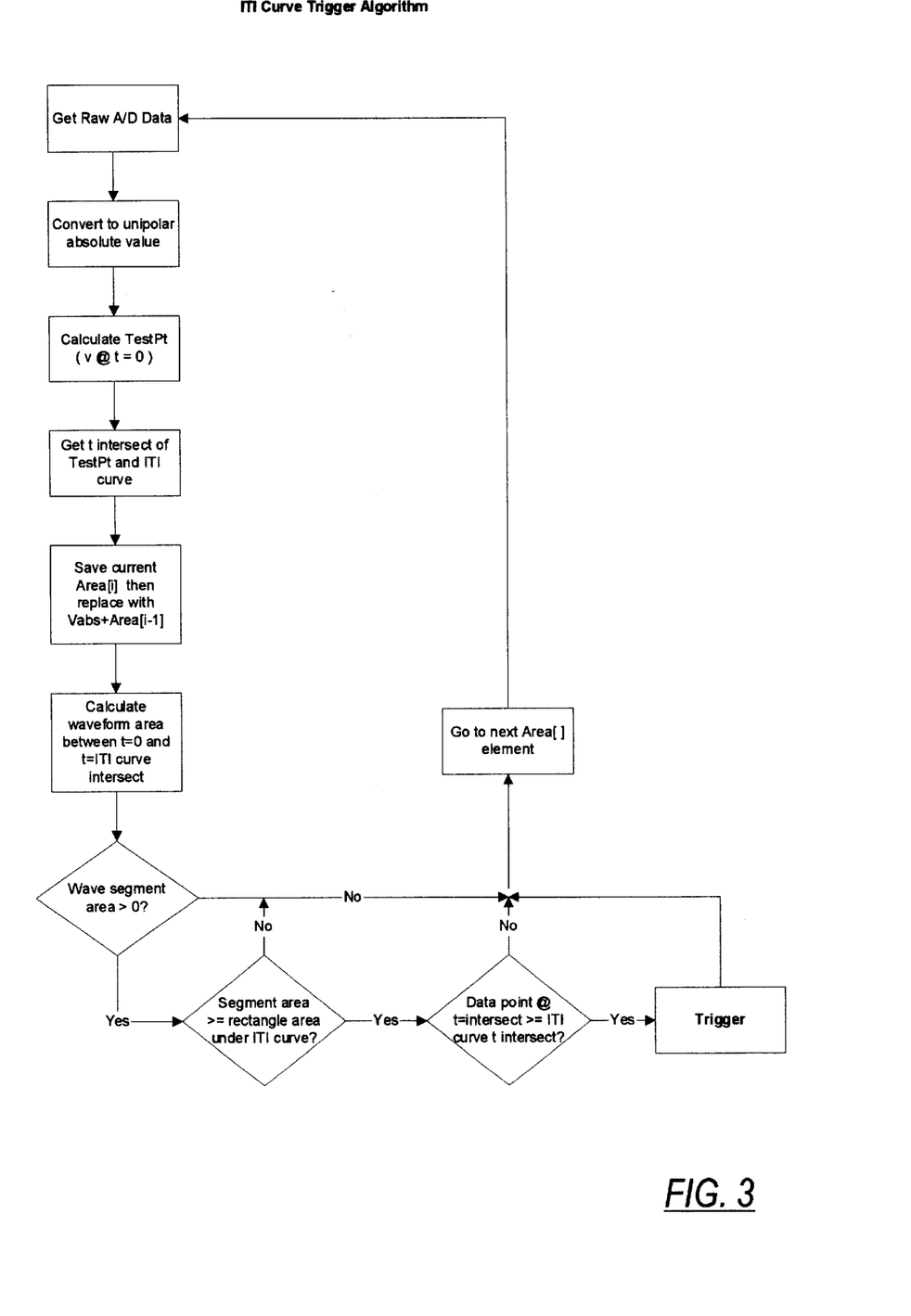
FIG. 3 is a flow chart of an ITI trigger algorithm.

A flow chart of the algorithm is shown in FIG. 3. The flow chart is shown for a waveform that moves from right to left in the window. If the wave moves from right to left the algorithm might not give accurate results for fast rise time signals because the rise time might be too fast. This is so because the intersection point of TestPt (at x=0) with the ITI curve may occur at a point where the waveform trailing edge might be within the ITI curve at the sampled test point, even though the waveform is a trigger point and would be detected if the trigger point just happened to be sampled at the right time but wasn't.

Since a typical transient has a faster rise time than fall time, it might be better to test the points on the trailing edge of the waveform rather than the leading edge. Running the mirror image of the waveform through the window from left to right can do this. This approach will work because:

1) Area under the waveform is used in the calculation. The area between any given pair of points on the waveform and its mirror image will be the same.

2) The horizontal width of the wave is used by the algorithm to determine if it spans over the ITI curve at all input voltages. Since the width of the waveform between any two voltage values will be the same on the wave and its mirror image, this approach will work.

For the typical asymmetric transient waveform, using the mirror image could provide some real advantages. Because of the way the algorithm works, if the wave goes through the window from left to right, the trailing edge of the wave will contain the test points rather than the leading edge. Since the trailing edge is usually slower, there will be more sample points for a given sample rate than the leading edge.

It may be necessary in some cases to run the wave in both directions and do the calculation in both directions simultaneously. But if it turns out that the vast majority of waveforms have faster rise than fall times, it may be adequate to run the wave from left to right only. In any case, one alternative would be to run the wave in both directions.

The 'C' program below has two separate parts for clarity. If the wave must be run through the window in both directions some of the instructions can be combined. A small window and line curve are used in place of the actual window and ITI curve. A test array Va[ ] is used for input data rather than actual data. The first section has the wave running from right to left and the second section runs the wave from left to right.

```c
#include <stdio.h>
#include "hello.h"
/*
 * ======= main =======
 */
// Real time ITI curve trigger calculator
// Assumes width of all area slivers is '1'
#define DACRESOLUTION 8
#define ARYMASK 7
unsigned int AreaRL[ARYMASK+1], AreaLR[ARYMASK+1];
unsigned int SigArea;
unsigned int LastSliver;
//short xIntersect[ ] = { 0, 3, 2, 1}; // ITI curve x intersect pre calculated
array
//int Rectangle[ ] = {0, 0 × 3, 0 × 4, 0 × 3}; // rectangle area under ITI curve
from G to intersection
short xIntersect[ ] = {0, 7, 6, 5, 4, 3, 2, 1};
unsigned int Rectangle[ ] = {0, 7, 12, 15, 16, 15, 12, 7};
short Vraw;     // Absolute value of input voltages
short Vabs, UpLimitIdx; // index of lower limit of integration
short TriggerLR, TriggerRL, TestPt;
short Va[ ] = {0 × 801, 0 × 803, 0 × 801, 0 × 801, 0 × 801, 0 × 801, 0 × 801, 0 × 800,
        0 × 800, 0 × 800, 0 × 800, 0 × 800, 0 × 800, 0 × 800, 0 × 800, 0 × 806,
        0 × 806, 0 × 800, 0 × 800, 0 × 800, 0 × 800, 0 × 800, 0 × 800, 0 × 804,
        0 × 804, 0 × 804, 0 × 804, 0 × 800, 0 × 800, 0 × 800, 0 × 800, 0 × 800,
        0 × 805, 0 × 805, 0 × 805, 0 × 800, 0 × 800, 0 × 800, 0 × 800, 0 × 800,
        0 × 807, 0 × 800, 0 × 800, 0 × 800, 0 × 800, 0 × 800, 0 × 800, 0 × 800);
// This program calculates ITI triggers from a stream of incoming data in
real time. Two arrays
// are precalculated and stored in memory to speed things up. xIntersect[ ]
stores the values of
// the x intersect point on the ITI curve for all values of y (2048 values)
Rectangle[ ] stores the
// value of the rectangular area under the intersect point for all values of
y (2048 values).
// A running total of the continuous integration of the incoming waveform is
stored in three
// circular arrays; AreaRL[ ], AreaVb[ ], AreaVc[ ]. Each array holds the
continuous value of the
// integration of the waveform through the trigger window.
main ( ) {
    short i, j, Vabs;
    TriggerLR = TriggerRL =0;
    LastSliver = 0;
    for (i=0; i<DACRESOLUTION; i++) {
        AreaRL[i] = 0;
        AreaLR[i] = 0;
    }
    i = 0;
    j = 0;
// blkcp(AreaRL, 0 × 805, xIntersect, Rectangle);
    while (1) {
// This section calculates trigger with wave moving from right to left
        Vraw = Va[j];
        Vabs = _abs(-0x800+Vraw);     // convert 12 bit unipolar to absolute
value
        TestPt = (AreaRL[(i+1)&ARYMASK] - AreaRL[i&ARYMASK]) & ARYMASK;
            // y value at x=0 point to test
// The value in xIntersect is '1' less than the actual value so that next
line saves a subtraction
// '0' means no intersect
        UpLimitIdx = (i + xIntersect[TestPt]) & ARYMASK; // x intersect at y =
TestPt
// Find area of input wave between 0 and xIntersect.
// Values range between 0 and ARYMASK - 1
        LastSliver = AreaRL[i];
        AreaRL[i] = Vabs + AreaRL[(i-1)&ARYMASK];      // calc and set area of
current sliver
        SigArea = (xIntersect[TestPt] == 0) ? 0 : AreaRL[UpLimitIdx] -
LastSliver;
        if (SigArea)
            if (SigArea >= Rectangle[xIntersect[TestPt]])   // area of curve >= area
of rectangle?
                if (AreaRL[UpLimitIdx] - AreaRL[UpLimitIdx - 1] >= TestPt)       //
data point >= curve point?
                    TriggerRL += 1;
// This section calculate trigger with wave moving from left to right
        AreaLR[i&ARYMASK] = AreaLR[(i-1)&ARYMASK] + Vabs;
        SigArea = (xIntersect[Vabs] == 0) ? 0 : AreaLR[i] - AreaLR[(i-
```

```
            xIntersect [Vabs])&ARYMASK];
                if (SigArea)
                    if (SigArea >= Rectangle[xIntersect[Vabs)]) // area of curve >= area of
        rectangle?
                        if (AreaLR[(i-xIntersect[Vabs]+1)&ARYMASK] - AreaLP[(i-
        xIntersect[Vabs])&ARYMASK] >= Vabs) // data point >= curve point?
                            TriggerLR += 1;
                i = (i + 1) & ARYMASK;
                j += 1;
                }
        }
```

All points on the ITI curve are compared to the input waveform with the resolution equal to the resolution of the DAC. Decimated voltage bands, multiple counters, or time consuming searches are not used.

The algorithm is completely deterministic. It takes the same amount of time to run for any waveform. All of the required complex calculations are done at initialization and the runtime algorithm is reduced to reading lookup tables and a series of additions and subtractions. It is anticipated that it can be run on an inexpensive, stand-alone DSP.

There is no difference in execution time for big or small windows. The only thing that changes is the amount of memory needed.

The algorithm needs to run on each channel. In a three-channel system it will need to run three times per sample period.

By today's standards, the invention requires a relatively small amount of memory. For a single direction wave with a resolution of 11 bits, a 1us sampled wave with a half cycle window would require 3*8192=24K of 32 bit memory for waveform integral storage, 2K of 32 bit memory for rectangle area storage, 2K of 16 bit memory for ITI curve storage. If unbalanced inputs are present, 4K more of 16 bit memory could be added to scale the ITI curve for each channel to compensate for the incorrect inputs. This adds up to about 116K.

Each of the sections reduces to only a few lines of 'C' code. Although writing the algorithm in 'C' could be too slow, a short assembly language program would faster. The algorithm could run on a relatively inexpensive DSP in real time with a 1us to 4us sample rate.

Using a waveform that moves in only one direction may significantly improve performance.

If the voltage threshold of the current transient module is set to a level less than 1400 volts, it can be thought of as an ITI curve tester that only checks a single voltage point on the curve. The algorithm described above checks all points on the curve and would provide customers with the wealth of information provided by the entire ITI curve with minimum cost. The ITI curve is a relatively low voltage measure of disturbances (1400 volts max) when compared with the present CVT (6000 volts) so it is an enhancement, not a replacement for the present system. It could be used along with the present system to provide much more data about what's happening at the lower voltages addressed by the ITI curve than the present CVT system. The present CVT system only triggers at a single set point and therefore can't provide information about events happening at anything less than the set point. This algorithm simultaneously tests the entire ITI curve and therefore can trigger on any disturbance that violates the curve, not just a single point.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A method for detecting, in real time, high energy transients in an electrical power system, said method comprising:

obtaining real time data defining a power waveform, converting said data to digital data;

calculating from said digital data a plurality of test point values, calculating incremental area values corresponding to differences between each adjacent pair of said plurality of test point values, an incremental time interval between adjacent said test point values being defined as a unit width of said area;

such that the cumulative area under the waveform at a given testpoint is equal to the sum of the area calculated at that test point and the area;

calculated at the previous test point;

calculating the area of the waveform between adjacent pairs of test points by substracting the cumulative area at the later in time of said test points from the cumulative area at the earlier in time of said test points; and comparing each said area calculated under said waveform with an area at corresponding points in time on an ITI curve.

2. The method of claim 1 and further including storing said plurality of test points on said ITI curve in an ITI array.

3. The method of claim 1 and further including storing the areas calculated each of said test points in an area array.

4. The method of claim 3 wherein said area array is a circular array, and wherein address calculations are performed using circular arithmetic.

5. The method of claim 1 and further including converting a current data input word to bipolar form and calculating the absolute value thereof.

6. The method of claim 1 wherein said calculating includes calculating the difference between two entries in the area array in order to determine the area under the waveform between the two data points corresponding to said two entries in the area array.

7. The method of claim 1 wherein unsigned substractions are used in the difference calculations.

8. The method of claim 1 and further including using the mirror image of said waveform defined by said real time data.

9. The method of claim 1 and further including running the wave in both forward and reverse directions and performing the calculations in both directions simultaneously.

10. A method for detecting, in real time, high energy transients in an electrical power system, said method comprising:

obtaining real time data defining a power waveform;

converting said real time data to digital form;

converting said digital data to a unipolar absolute value;

calculating a test point;

determining a time intersect of said test point and an ITI curve;

calculating an area corresponding to said test point and replacing the calculated area with the sum of said absolute value and an area at a prior test point;

calculating an area of the waveform between a zero time intersect and an ITI curve time intersect with said test point;

determining whether said waveform area is greater than or equal to a rectangular area under said ITI curve at said time intersect;

if not, advancing to the next test point;

if so, determining whether the data point at said time intersect is greater than or equal than the value of the ITI curve at said time intersect; and if not, advancing to the next data point, and if so, producing a trigger command.

11. The method of claim 10 and further including storing said plurality of test points on said ITI curve in an ITI array.

12. The method of claim 10 and further including storing the areas calculated each of said test points in an area array.

13. The method of claim 12 wherein said area array is a circular array, and wherein address calculations are performed using circular arithmetic.

14. The method of claim 10 and further including converting a current data input word to bipolar form and calculating the absolute value thereof.

15. The method of claim 10 wherein said calculating includes calculating the difference between two entries in the area array in order to determine the area under the waveform between the two data points corresponding to said two entries in the area array.

16. The method of claim 10 wherein unsigned substractions are used in the difference calculations.

17. The method of claim 10 and further including using the mirror image of said waveform defined by said real time data.

18. The method of claim 10 and further including running the wave in both forward and reverse directions and performing the calculations in both directions simultaneously.

19. A system for detecting, in real time, high energy transients in an electrical power system, said system comprising:

means for obtaining real time data defining a power waveform, means for converting said data to digital data;

means for calculating from said digital data a plurality of test point values, means for calculating incremental area values corresponding to differences between each adjacent pair of said plurality of test point values, the incremental time between adjacent said test point values being defined as a unit with of said area;

such that the cumulative area under the waveform at a given test point is equal to the sum of the area calculated at that test point and the area;

means for calculated at the previous test point;

means for calculating the area of the waveform between adjacent pairs of test points by substracting the cumulative area at the later in time of said test points from the cumulative area at the earlier in time of said test points; and means for comparing each said area calculated under said waveform with an area at corresponding points in time on an ITI curve.

20. The system of claim 19 and further including means for storing said plurality of test points on said ITI curve in an ITI array.

21. The system of claim 19 and further including means for storing the areas calculated each of said test points in an area array.

22. The system of claim 21 wherein said area array is a circular array, and wherein address calculations are performed using circular arithmetic.

23. The system of claim 19 and further including means for converting a current data input word to bipolar form and means for calculating the absolute value thereof.

24. The system of claim 19 wherein said means for calculating includes means for calculating the difference between two entries in the area array in order to determine the area under the waveform between the two data points corresponding to said two entries in the area array.

25. The system of claim 19 wherein unsigned substractions are used in the difference calculations.

26. The system of claim 19 and further including using the mirror image of said waveform defined by said real time data.

27. The system of claim 19 and further including running the wave in both forward and reverse directions and performing the calculations in both directions simultaneously.

28. A system for detecting, in real time, high energy transients in an electrical power system, said method comprising:

means for obtaining real time data defining a power wave form;

means for converting said real time data to digital form;

means for converting said digital data to a unipolar absolute value;

means for calculating a test point;

means for determining a time intersect of said test point and an ITI curve;

means for calculating an area corresponding to said test point and replacing the calculated area with the sum of said absolute value and an area at a prior test point;

means for calculating an area of the waveform between a zero time intersect and an ITI curve time intersect with said test point;

means for determining whether said waveform area is greater than or equal to a rectangular area under said ITI curve at said time intersect;

if not, advancing to the next test point;

if so, determining whether the data point at said time intersect is greater than or equal than the value of the ITI curve at said time intersect, if not, advancing to the next data point, and if so, producing a trigger command.

29. The system of claim 28 and further including means for storing said plurality of test points on said ITI curve in an ITI array.

30. The system of claim 28 and further including means for storing the areas calculated each of said test points in an area array.

31. The system of claim 30 wherein said area array is a circular array, and wherein address calculations are performed using circular arithmetic.

32. The system of claim 28 and further including means for converting a current data input word to bipolar form and means for calculating the absolute value thereof.

33. The system of claim 28 wherein said means for calculating includes means for calculating the difference between two entries in the area array in order to determine the area under the waveform between the two data points corresponding to said two entries in the area array.

34. The system of claim 28 wherein unsigned substractions are used in the difference calculations.

35. The system of claim 28 and further including using the mirror image of aid waveform defined by said real time data.

36. The system of claim 28 and further including running the wave in both forward and reverse directions and performing the calculations in both directions simultaneously.

* * * * *